(12) United States Patent
Lu et al.

(10) Patent No.: US 10,510,857 B2
(45) Date of Patent: Dec. 17, 2019

(54) THIN FILM TRANSISTOR, METHOD FOR MANUFACTURING THE SAME AND DISPLAY DEVICE

(71) Applicant: BOE TECHNOLOGY GROUP CO., LTD., Beijing (CN)

(72) Inventors: Xinhong Lu, Beijing (CN); Ke Wang, Beijing (CN); Wei Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/865,793

(22) Filed: Jan. 9, 2018

(65) Prior Publication Data

US 2018/0337245 A1    Nov. 22, 2018

(30) Foreign Application Priority Data

May 17, 2017    (CN) .......................... 2017 1 0349240

(51) Int. Cl.
*H01L 29/49* (2006.01)
*H01L 29/417* (2006.01)
(Continued)

(52) U.S. Cl.
CPC .... *H01L 29/4908* (2013.01); *H01L 21/02178* (2013.01); *H01L 21/02252* (2013.01); *H01L 21/31116* (2013.01); *H01L 29/41733* (2013.01); *H01L 29/42384* (2013.01); *H01L 29/78642* (2013.01)

(58) Field of Classification Search
CPC ......... H01L 21/02178; H01L 21/02252; H01L 21/31116; H01L 29/4908; H01L 29/41733; H01L 29/42384
See application file for complete search history.

(56) References Cited

U.S. PATENT DOCUMENTS

| | | | |
|---|---|---|---|
| 7,256,458 B2 * | 8/2007 | Nowak | H01L 29/66795 257/347 |
| 8,530,273 B2 * | 9/2013 | Den Boer | H01L 29/78603 257/E21.533 |

(Continued)

OTHER PUBLICATIONS

Jin-Seong Park, Jae Kyeong Jeong, Yeon-Gon Mo, and Hye Dong Kim, Improvements in the device characteristics of amorphous indium gallium zinc oxide thin-film transistors by Ar plasma treatment, Appl. Phys. Lett. 90, 262106 (2007) (Year: 2007).*

(Continued)

*Primary Examiner* — Mark W Tornow
(74) *Attorney, Agent, or Firm* — Brooks Kushman P.C.

(57) ABSTRACT

A method for manufacturing a thin film transistor includes: forming a source electrode and a first insulation pattern, where an orthographic projection of the first insulation pattern at a substrate is within an orthographic projection of the source electrode at the substrate; forming an active layer, a second insulation pattern and a gate electrode on the substrate, an exposed portion of the source electrode not covered by the first insulation pattern and the first insulation pattern; exposing a first portion of the action layer on the first insulation pattern by removing parts of the gate electrode and the second insulation pattern; and performing a plasma treatment to the exposed first portion, thereby forming a drain electrode.

11 Claims, 5 Drawing Sheets

(51) Int. Cl.
*H01L 21/02* (2006.01)
*H01L 21/311* (2006.01)
*H01L 29/423* (2006.01)
*H01L 29/786* (2006.01)

(56) References Cited

U.S. PATENT DOCUMENTS

| | | | | |
|---|---|---|---|---|
| 9,105,468 | B2* | 8/2015 | Rabkin | H01L 21/02403 |
| 2011/0253998 | A1* | 10/2011 | Theiss | H01L 29/4908 |
| | | | | 257/43 |
| 2016/0204267 | A1* | 7/2016 | Moon | H01L 29/7869 |
| | | | | 257/43 |

OTHER PUBLICATIONS

Byung Du Ahn, Hyun Soo Shin, Hyun Jae Kim, Jin-Seong Park, and Jae Kyeong Jeong, Comparison of the effects of Ar and H2 plasmas on the performance of homojunctioned amorphous indium gallium zinc oxide thin film transistors, Appl. Phys. Lett. 93, (2008) (Year: 2008).*

* cited by examiner

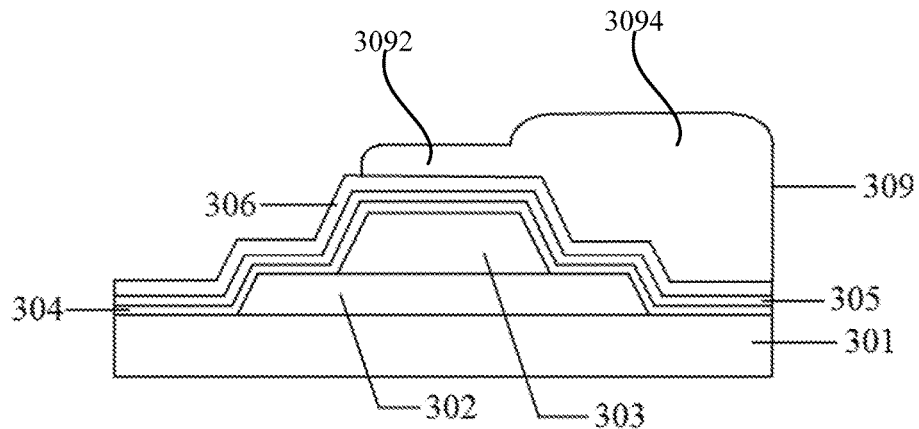
FIG. 12
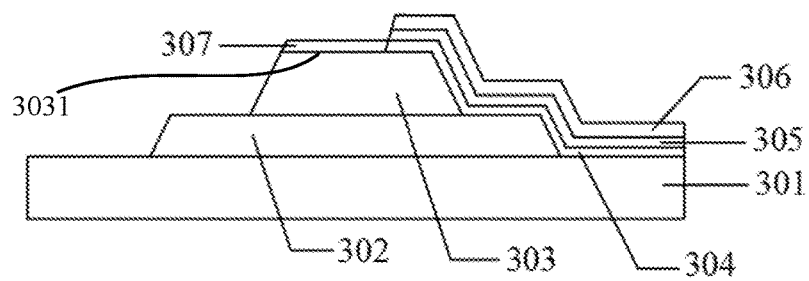
FIG. 13
FIG. 14

THIN FILM TRANSISTOR, METHOD FOR MANUFACTURING THE SAME AND DISPLAY DEVICE

CROSS-REFERENCE TO RELATED APPLICATION

This application claims priority to Chinese Patent Application No. 201710349240.6, filed on May 17, 2017, which is incorporated herein by reference in its entirety.

TECHNICAL FIELD

The present disclosure relates to the field of thin film transistors, and in particular to a thin film transistor, a method for manufacturing the same and a display device.

BACKGROUND

Recently, with the rapid development of augmented reality (AR) display and virtual reality (VR) display, development of ultra-high PPI (which is equal to or greater than 1000 PPI) backplate technology is gradually becoming a mainstream direction. Oxide materials have been the main materials selected for backplates due to their excellent performance and simple fabrication process. However, oxide thin film transistors (TFTs) of back channel etch type and oxide thin film transistors of top gate type have large sizes and thus are not suitable for ultra-high PPI oxide array substrates. TFTs of vertical structure of oxide array substrates have sizes smaller than those of the oxide thin film transistors of back channel etch type and the oxide thin film transistors of top gate type, and have good TFT characteristic, thus, the oxide TFT of vertical structure has a good application prospects in ultra-high PPI backplates.

However, one method for manufacturing the TFTs of vertical structure of oxide array substrates generally includes at least four times of mask processes, i.e., four times of patterning processes, which makes the production process more cumbersome.

SUMMARY

Embodiments of the present disclosure provide a thin film transistor, a method for manufacturing the same and a display device, which can solve the problem that the method for manufacturing thin film transistors in the related art is cumbersome, and can improve display effect of the thin film transistors.

According to a first aspect, a method for manufacturing a thin film transistor is disclosed and includes: forming a source electrode and a first insulation pattern on a substrate; where an orthographic projection of the first insulation pattern at the substrate is within an orthographic projection of the source electrode at the substrate; forming an active layer, a second insulation pattern and a gate electrode on the substrate, an exposed portion of the source electrode which is not covered by the first insulation pattern, and the first insulation pattern; exposing a first portion of portions of the action layer on the first insulation pattern by removing a part of the gate electrode and a part of the second insulation pattern on the active layer; and performing a plasma treatment to the exposed first portion of the active layer, thereby forming a drain electrode.

Further, the forming a source electrode and a first insulation pattern on a substrate includes: forming a first metal layer on the substrate; forming the source electrode by performing a first patterning process to the first metal layer; forming a silicon oxide layer on the source electrode; and forming the first insulation layer by performing a second patterning process to the silicon oxide layer.

Further, the forming a source electrode and a first insulation pattern on a substrate includes: forming a first metal layer on the substrate; forming a silicon oxide layer on the first metal layer; coating first photoresist on the silicon oxide layer; exposing and developing the first photoresist with a first mask plate, and then etching the silicon oxide layer and the first metal layer, thereby forming an etched silicon oxide layer and the source electrode; ashing a part of the first photoresist to expose a first portion of the silicon oxide layer with a second portion of the silicon oxide layer being covered by the remained first photoresist; and removing away the exposed first portion of the silicon oxide layer, thereby forming the first insulation pattern with the second portion of the silicon oxide layer.

Further, the forming an active layer, a second insulation pattern and a gate electrode on the substrate, an exposed portion of the source electrode which is not covered by the first insulation pattern, and the first insulation pattern includes: forming a first oxide layer, a second oxide layer and a second metal layer on the substrate, the exposed portion of the source electrode which is not covered by the first insulation pattern, and the first insulation pattern; coating second photoresist on the second metal layer in such a manner that a thickness of a first portion of the second photoresist is smaller than a thickness of a second portion of the second photoresist, the first portion of the second photoresist is corresponding to a region where the drain electrode is formed, and the second portion of the second photoresist is corresponding to a region where the gate electrode, the second insulation pattern and the active layer are formed; and exposing and developing the second photoresist with a half-tone mask plate, and then etching the second metal layer, the second oxide layer and the first oxide layer, thereby obtaining the gate electrode, the second insulation pattern and the active layer.

Further, the exposing a first portion of portions of the action layer on the first insulation pattern by removing a part of the gate electrode and a part of the second insulation pattern on the active layer, includes: removing away the first portion of the second photoresist by ashing the second photoresist, thereby exposing a part of the gate electrode on the active layer; and etching the exposed part of the gate electrode and the second insulation pattern under the exposed part of the gate electrode, thereby exposing the first portion of the active layer on the first insulation pattern.

Further, plasma gas used in the plasma treatment is selected from at least one of He, $NH_3$ and $H_2$.

Further, the exposing a first portion of portions of the action layer on the first insulation pattern by removing a part of the gate electrode and a part of the second insulation pattern on the active layer, includes: removing the part of the gate electrode and the part of the second insulation pattern on the active layer in such a manner that the first portion of portions of the active layer on a top surface of the first insulation pattern is exposed, and a second portion of the portions of the active layer on the top surface of the first insulation pattern is covered by the gate electrode and the second insulation pattern.

According to a second aspect, a thin film transistor is provided and includes: a source electrode; a first insulation pattern; a drain electrode; and an active layer with one part on the first insulation pattern. The drain electrode and the one part of the active layer on the first insulation pattern are in an identical layer.

Further, the drain electrode is made of a material formed by converting the material which is used to form the active layer into a conductor by means of the plasma treatment.

Further, the active layer is made of a material selected from at least one of indium gallium zinc tin oxide (IGZTO), indium tin zinc oxide (ITZO) and indium tin gallium oxide (ITGO); and the drain electrode is made of a material selected from at least one of indium tin zinc oxide, indium tin gallium oxide and indium gallium zinc tin oxide which are conductive via plasma treatment.

Further, the thin film transistor further includes a second insulation pattern on the active layer and a gate electrode on the second insulation pattern.

Further, each of the source electrode and the gate electrode is made of material selected from at one of Mo, Cu, Al, AlNd, and indium tin oxide (ITO).

Further, the second insulation pattern is made of $Al_2O_3$.

Further, the first insulation pattern is made of silicon oxide.

Further, the first insulation pattern has a thickness which is greater than or equal to 4000 Å.

Further, the active layer covers an exposed portion of the source electrode which is not covered by the first insulation pattern, and a part of the source electrode which is covered by the first insulation pattern.

Further, one part of the active layer is in direct contact with the exposed portion of the source electrode which is not covered by the first insulation pattern, and another part of the active layer is in direct contact with one part of the first insulation pattern.

According to a third aspect, a display device is provided and includes the above thin film transistor.

BRIEF DESCRIPTION OF THE DRAWINGS

The accompanying drawings, which are incorporated in and constitute a part of this specification, illustrate embodiments consistent with the disclosure and, together with the description, serve to explain the principles of the disclosure.

FIG. 12 is a schematic structural view of a structure obtained by coating a second photoresist on a second metal layer of the structure shown in FIG. 4 according to another exemplary embodiment.

FIG. 13 is a flow chart of a process of removing parts of the gate electrode and the second insulation pattern on the active layer in the structure shown in FIG. 12.

FIG. 14 is a schematic structural view of a thin film transistor according to an exemplary embodiment.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise indicated. The implementations set forth in the following description of exemplary embodiments do not represent all implementations consistent with the disclosure. Instead, they are merely examples of apparatuses and methods consistent with aspects related to the disclosure as recited in the appended claims.

Figure 1:
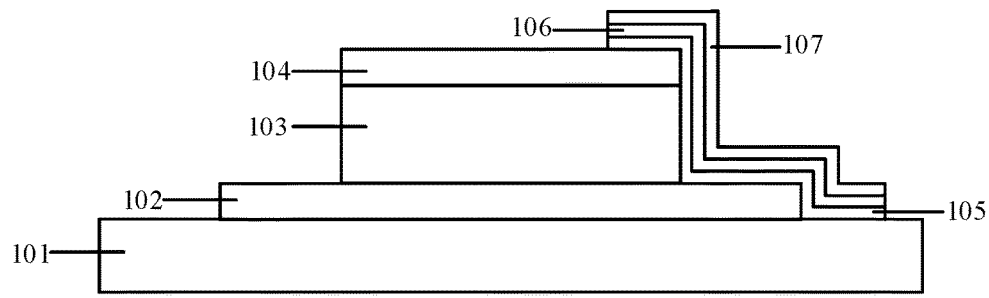
FIG. 1 is a schematic structural view of a thin film transistor in related art.

FIG. 1 is a schematic structural view of a thin film transistor in related art. As shown in FIG. 1, the thin film transistor in related art may be manufactured according to a method, which includes: (1) forming a source electrode 102 on a substrate 101 with a mask plate by means of a first patterning process; (2) forming a first insulation pattern 103 on the source electrode 102 with another mask plate by means of a second patterning process; (3) forming a drain electrode 104 on the first insulation pattern 103 with another mask plate by means of a third patterning process; (4) forming an active layer 105, a second insulation layer 106 and a gate electrode 107 with another mask plate by means of a fourth patterning process in such a manner that the active layer 105, the second insulation layer 106 and the gate electrode 107 are stacked.

Thus, the above method for manufacturing the thin film transistor in related art includes four times of patterning processes with mask plates, which makes the manufacturing process cumbersome. Further, in the thin film transistor in related art, as shown in FIG. 1, since a part of the active layer 105 is on a surface of the drain electrode 104, a dual-layer overlap structure is formed by the drain electrode 104 and the active layer 105, thereby forming overlapping parasitic capacitance and then affecting display effect. In addition, the drain electrode 104 and the active layer 105 are usually made of different materials (for example, the drain electrode 104 is made of metal and the active layer 105 is made of oxide material), which results in poor ohmic contact and further affects display effect.

Figure 2:
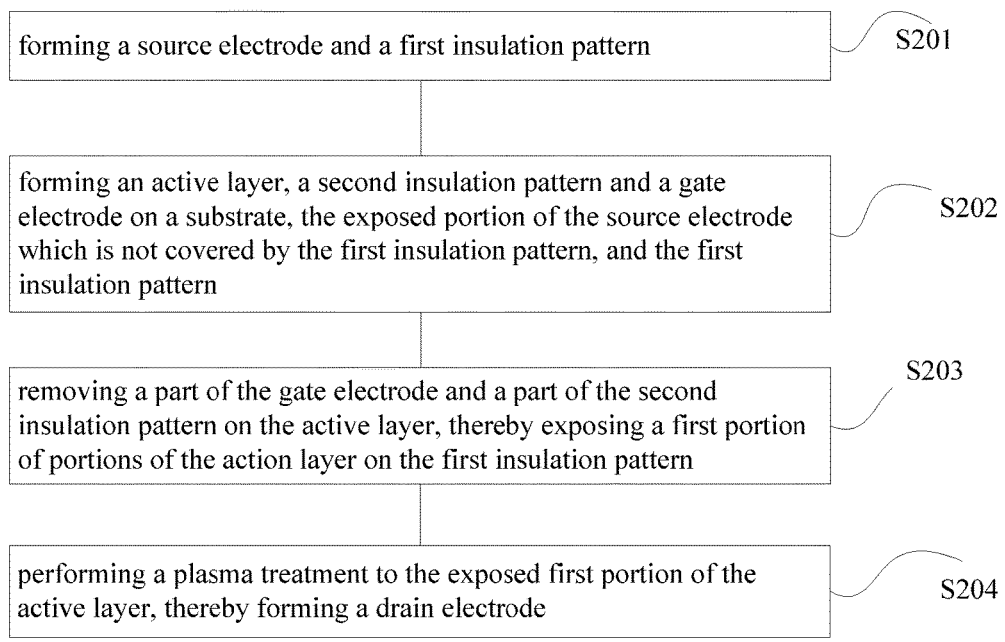
FIG. 2 is a flow chart of a method for manufacturing thin film transistors according to an exemplary embodiment.

In order to solve the above technical problem, one embodiment of the present disclosure provides a method for manufacturing thin film transistors with vertical structures. As shown in FIG. 2, the method includes the following steps S201 to S204.

The step S201 is to form a source electrode and a first insulation pattern on a substrate in such a manner that the first insulation pattern is stacked on the source electrode.

Figure 3:
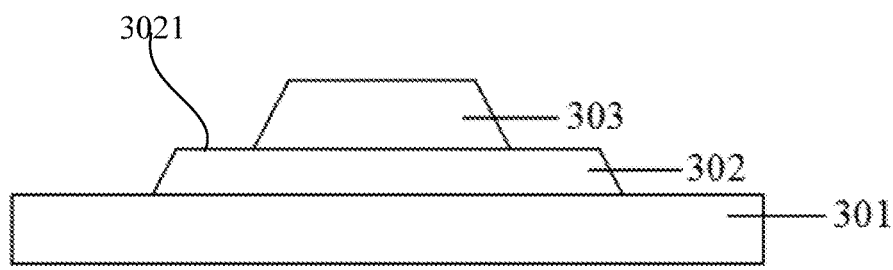
FIG. 3 is a schematic structural view of a structure obtained by forming a source electrode and a first insulation pattern on a substrate according to the method for manufacturing thin film transistors according to an exemplary embodiment.
Figure 4:
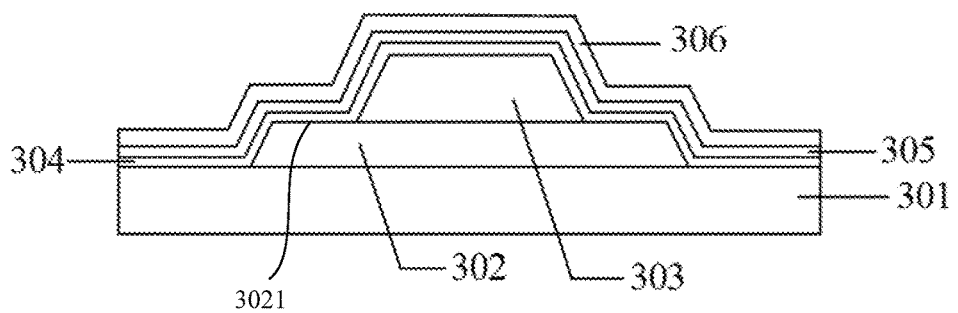
FIG. 4 is a schematic structural view of a structure obtained by forming an active layer, a second insulation pattern and a gate electrode on the structure shown in FIG. 3 according to the method for manufacturing thin film transistors according to an exemplary embodiment.

A structure obtained through the step S201 is shown in FIG. 3. An orthographic projection of the first insulation pattern 303 at the substrate 301 is located within an orthographic projection of the source electrode 302 at the substrate 301. An area of the orthographic projection of the first insulation pattern 303 at the substrate 301 is smaller than an area of the orthographic projection of the source electrode 302 on the substrate 301. Thus, a portion of a surface of the source electrode 302 is not covered by the first insulation pattern 303, and the portion of the source electrode 302, which is not covered by the first insulation pattern 303, may be referred as an exposed portion 3021 of the source electrode 302. The presence of the exposed portion 3021 of the source electrode 302 can enable an active layer 304 (as shown in FIG. 4) to be in contact with the exposed portion 3021 of the source electrode 302 in the subsequent steps. The source electrode 302 may be made of common metal material, or transparent conductive oxide material. For example, the source electrode 302 may be made of material selected from at one of Mo, Cu, Al, AlNd, and indium tin oxide (ITO). The first insulation pattern 303 is made of SiOx, and has a thickness which is greater than or equal to 4000 Å, thereby ensuring insulation effect.

The step S202 is to form an active layer, a second insulation pattern and a gate electrode on the substrate, the exposed portion of the source electrode which is not covered by the first insulation pattern, and the first insulation pattern in such a manner that the active layer, the second insulation pattern and the gate electrode are stacked on one another.

A structure obtained through the step S202 is shown in FIG. 4. The active layer 304 covers surfaces of the substrate 301, the source electrode 302 and the first insulation pattern 303, and is in contact with the exposed portion 3021 of the source electrode 302. The second insulation pattern 305 and the gate electrode 306 are formed on a surface of the active layer 304. The active layer 304 is made of oxide material. Since it is needed in the subsequent steps to use an etching liquid to remove the second insulation pattern 305, the active layer 304 may be made of oxide material which is resistant to the etching liquid, to prevent the active layer 304 from being damaged by the etching liquid. The second insulation pattern 305 is made of high-k metal oxide dielectric material to reduce leakage of electricity. For example, the second insulation pattern 305 may be made of $Al_2O_3$, and the active layer 304 may be made of oxide material which is resistant to Al etching liquid. The active layer 304 may be made of a material selected from at least one of indium gallium zinc tin oxide (IGZTO), indium tin zinc oxide (ITZO) and indium tin gallium oxide (ITGO). The gate electrode 306 may be made of the same material as the source electrode 302, and may be made of material selected from at least one of Mo, Cu, Al, AlNd and indium tin oxide (ITO).

The step S203 is to remove a part of the gate electrode and a part of the second insulation pattern on the active layer, thereby exposing a first portion of portions of the action layer on the first insulation pattern.

Figure 5:
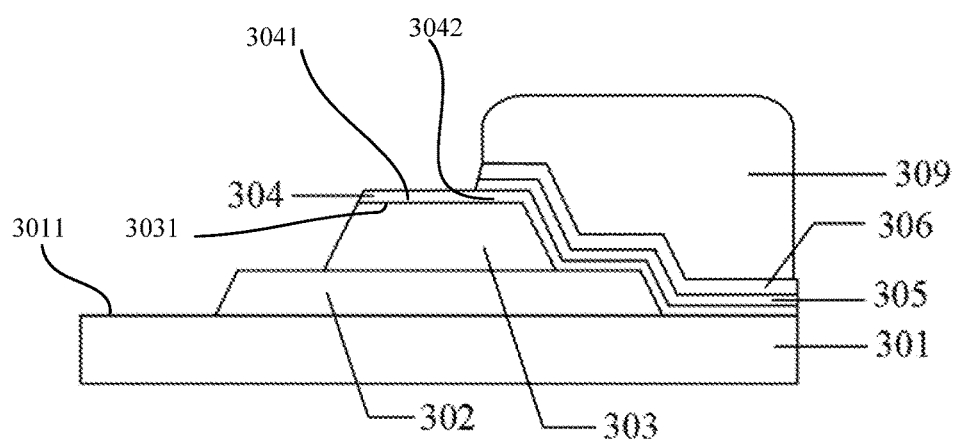
FIG. 5 is a schematic structural view of a structure obtained by removing parts of the gate electrode and the second insulation pattern on the active layer in the structure shown in FIG. 4 according to the method for manufacturing thin film transistors according to an exemplary embodiment.

A structure obtained through the step S203 is shown in FIG. 5. Through this step, a part of the gate electrode 306 and a part of the second insulation pattern 305 on the active layer 304 are removed, so that the first portion 3041 of portions of the action layer 304 on the first insulation pattern 303 is not covered by the gate electrode 306 and the second insulation pattern 305, thereby exposing the first portion 3041 of the action layer 304 so as to facilitate treatment of the first portion 3041 of the action layer 304 in the subsequent steps.

In addition, as shown in FIG. 5, a second portion 3042 of portions of the action layer 304 on the first insulation pattern 303 is adjacent the first portion 3041 of the action layer 304. The second portion 3042 is covered by the gate electrode 306 and the second insulation pattern 305. Further, as shown in FIG. 5, the first portion 3041 of the action layer 304 and one part of the second portion 3042 on a top surface 3031 of the first insulation pattern 303, are in an identical layer on the top surface 3031 of the first insulation pattern 303. The top surface 3031 of the first insulation pattern 303 is substantially parallel to a top surface 3011 of the substrate 301.

The step S204 is to perform a plasma treatment to the exposed first portion of the active layer, thereby forming a drain electrode.

Figure 6:
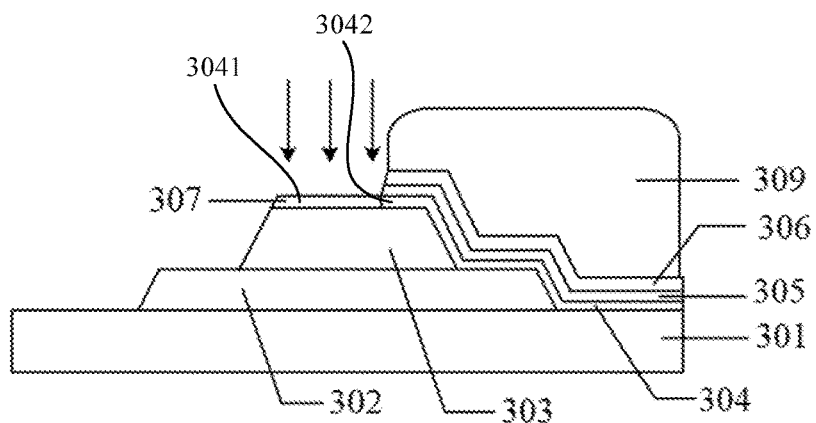
FIG. 6 is a schematic diagram showing performing a plasma treatment to an exposed first portion of the active layer according to the method for manufacturing thin film transistors according to an exemplary embodiment.

FIG. 6 is a schematic diagram showing performing a plasma treatment to the exposed first portion 3041 of the active layer 304. This step may be implemented by means of plasma enhanced chemical vapor deposition (PECVD) technology. Plasma gas used in this step may be selected from at least one of He, $NH_3$ and $H_2$. Different plasma treatment process conditions may be adopted according to different materials adopted for the active layer 304. The exposed first portion 3041 of the active layer 304 is converted into a conductor by means of the plasma treatment, thereby forming the drain electrode 307. Since the drain electrode 307 is obtained by converting a part of the active layer 304 into a conductor by means of the plasma treatment, materials of the drain electrode 307 and the active layer 304 are the same. For example, the active layer 304 may be made of material such as indium tin zinc oxide, indium tin gallium oxide and indium gallium zinc tin oxide; and then the drain electrode 307 may be made of material such as indium tin zinc oxide, indium tin gallium oxide and indium gallium zinc tin oxide which are conductive due to the plasma treatment. It should be noted that, herein, "materials of the drain electrode 307 and the active layer 304 are the same" means that the drain electrode 307 is made of a material formed by converting the material which is used to form the active layer 304 into a conductor by means of the plasma treatment.

Through the above steps, compared with the related art, one mask process for manufacturing the drain electrode 307 can be eliminated, thereby simplifying the process and improving productivity.

Figure 7:
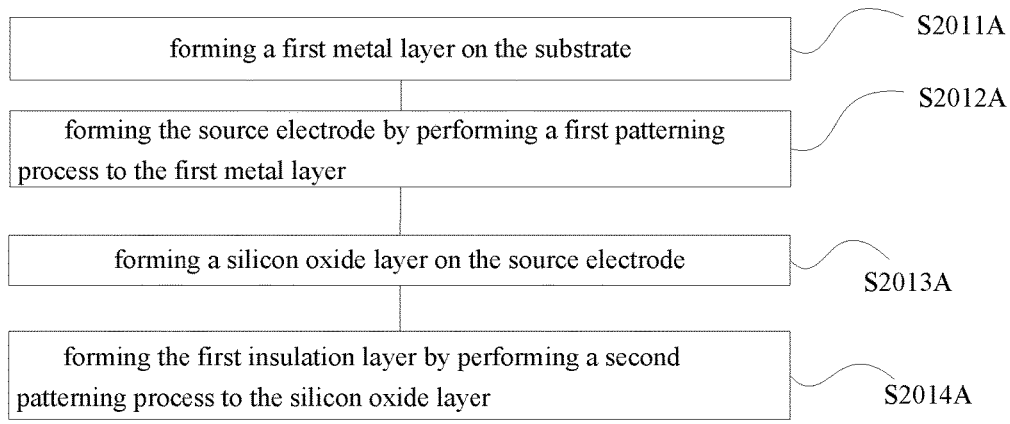
FIG. 7 is a flow chart of a process of forming a source electrode and a first insulation pattern on a substrate according to an exemplary embodiment.

Specifically, in an optional embodiment, as shown in FIG. 2 and FIG. 7, the step S201 can be implemented in the following process including steps S2011A to S2014A.

The step S2011A is to form a first metal layer on the substrate.

Specifically, the first metal layer may be deposited on the substrate. The first metal layer is used to form the source electrode 302. The first metal layer may be made of material which may be the same as the material used to form the source electrode 302 described in the above step S201.

The step S2012A is to form the source electrode by performing a first patterning process to the first metal layer.

The specific process of the first patterning process includes: first coating photoresist on the first metal layer, exposing and developing the photoresist with one mask plate, and then etching the first metal layer, thereby forming the drain electrode 302.

The step S2013A is to form a silicon oxide layer on the source electrode.

Specifically, the silicon oxide layer may be deposited on the source electrode. The silicon oxide layer is used to form the first insulation layer 303.

The step S2014A is to form the first insulation layer by performing a second patterning process to the silicon oxide layer.

The specific process of the second patterning process includes: first coating photoresist on the silicon oxide layer, exposing and developing the photoresist with one mask plate, and then etching the silicon oxide layer, thereby forming the first insulation layer 303.

Through the above steps, the source electrode 302 and the first insulation layer 303 are formed by two mask processes, i.e., two times of patterning process.

Figure 8:
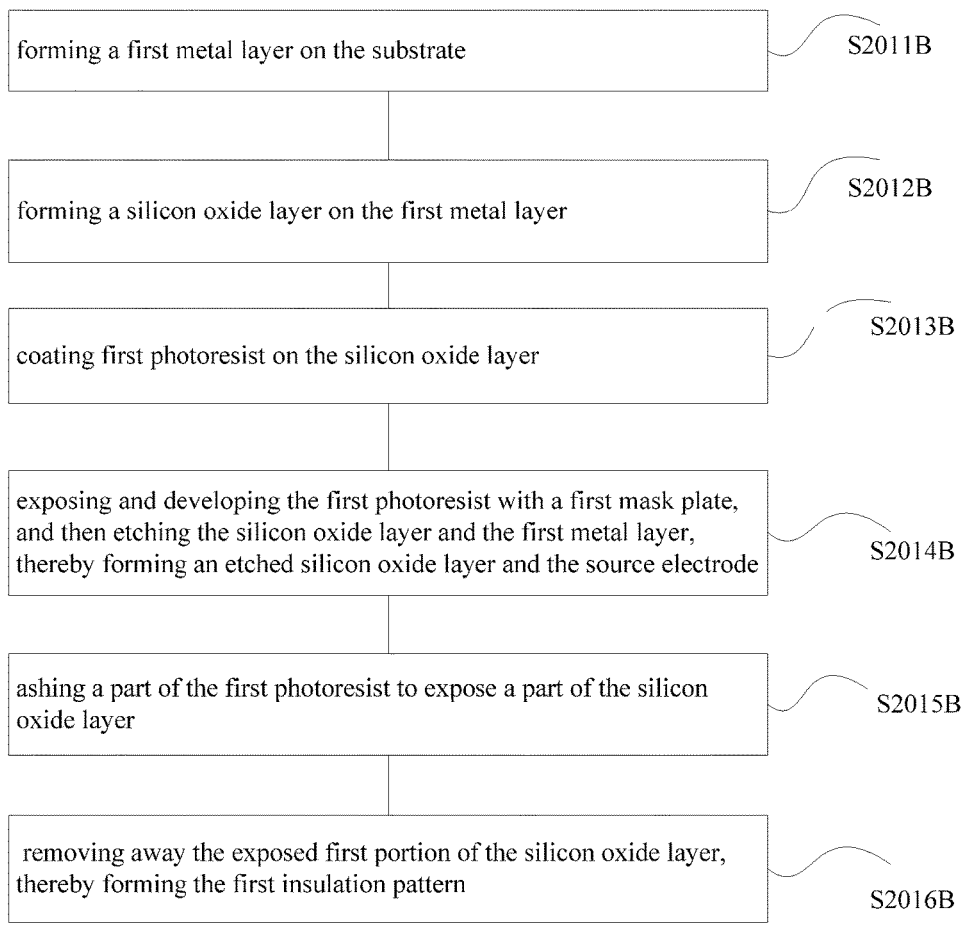
FIG. 8 is a flow chart of a process of forming a source electrode and a first insulation pattern on a substrate according to another exemplary embodiment.
Figure 9:
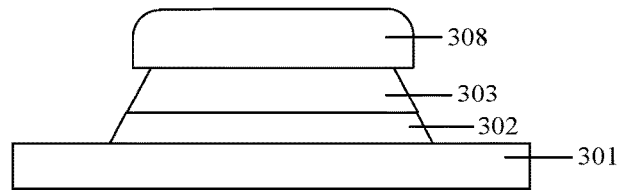
FIG. 9 is a schematic structural view of an intermediate product formed according to the process shown in FIG. 8.
Figure 10:
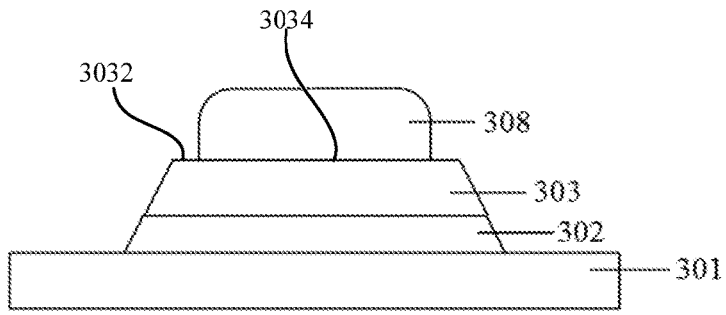
FIG. 10 is a schematic structural view of a structure obtained by ashing a part of a first photoresist of the intermediate product shown in FIG. 9.

In another optional embodiment, as shown in FIG. 8 to FIG. 10, the step S201 can be implemented in the following process including steps S2011B to S2016B.

The step S2011B is to form a first metal layer on the substrate.

Specifically, the first metal layer may be deposited on the substrate. The first metal layer is used to form the source electrode 302. The first metal layer may be made of material which may be the same as the material used to form the source electrode 302 described in the above step S201.

The step S2012B is to form a silicon oxide layer on the first metal layer.

Specifically, the silicon oxide layer may be deposited on the first metal layer. The silicon oxide layer is used to form the first insulation layer 303.

The step S2013B is to coat first photoresist on the silicon oxide layer.

The step S2014B is to expose and develop the first photoresist with a first mask plate, and then etch the silicon oxide layer and the first metal layer, thereby forming an etched silicon oxide layer and the source electrode.

Through this step, a pattern of the source electrode 302 can be formed. Meanwhile, a pattern of to-be-reserved silicon oxide layer is formed, as shown in FIG. 9.

The step S2015B is to ash a part of the first photoresist to expose a part of the silicon oxide layer.

As shown in FIG. 9 and FIG. 10, by means of ashing, a part of the photoresist 308 on a surface of the silicon oxide layer is removed, so that a surface of a first portion 3032 of the silicon oxide layer is not covered by the photoresist 308, and thus the first portion 3032 of the silicon oxide layer is exposed so as to facilitate treatment of the first portion 3032 in the subsequent step. In addition, a second portion 3034 of the silicon oxide layer is covered by the photoresist 308.

The step S2016B is to remove away the exposed first portion 3032 of the silicon oxide layer, thereby forming the first insulation pattern with the second portion 3034 of the silicon oxide layer.

Specifically, the exposed first portion 3032 of the silicon oxide layer maybe removed away by means of dry etching. A structure obtained through this step is shown in FIG. 3. An orthographic projection of the first insulation pattern 303 at the substrate 301 is located within an orthographic projection of the source electrode 302 at the substrate 301. An area of the orthographic projection of the first insulation pattern 303 at the substrate 301 is smaller than an area of the orthographic projection of the source electrode 302 on the substrate 301. Thus, a portion of a surface of the source electrode 302, i.e., the surface of the exposed portion 3021, is not covered by the first insulation pattern 303, thereby enabling the active layer 304 to be in contact with the exposed portion 3021 of the source electrode 302 in the subsequent steps.

Through the above steps, the source electrode 302 and the first insulation layer 303 are formed by means of one mask process, i.e., one patterning process; compared with the related art, one time of patterning process can be eliminated, thereby facilitating improvement of efficiency.

Figure 11:
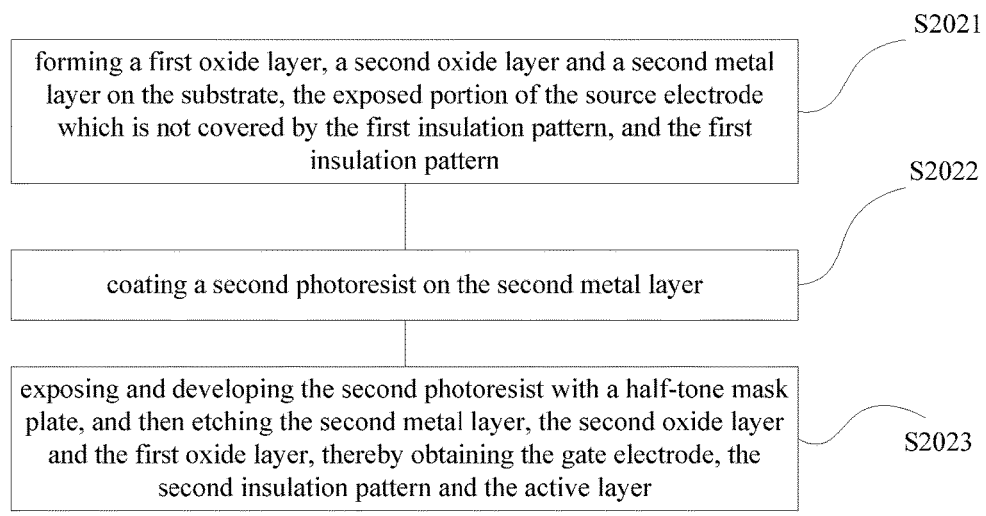
FIG. 11 is a flow chart of a process of forming an active layer, a second insulation pattern and a gate electrode on the structure shown in FIG. 3 according to another exemplary embodiment.

Specifically, as shown in FIG. 4, FIG. 11 and FIG. 12, the step S202 may include the following steps S2021 to S2023.

The step S2021 is to form a first oxide layer, a second oxide layer and a second metal layer on the substrate, the exposed portion of the source electrode which is not covered by the first insulation pattern, and the first insulation pattern.

Specifically, the first oxide layer, the second oxide layer and the second metal layer may be formed in a continuous deposition manner. The first oxide layer is used to form the active layer 304, and is made of material which may be the same as the material used to form the active layer 304 described in the above step S202. The second oxide layer is used to form the second insulation layer, and is made of material which may be the same as the material used to form the second insulation layer 305 described in the above step S202. The second metal layer is used to form the gate electrode 306, and is made of material which may be the same as the material used to form the gate electrode 306 described in the above step S202.

The step S2022 is to coat a second photoresist on the second metal layer.

As shown in FIG. 12, a thickness of a first portion 3092 of the second photoresist 309 is smaller than a thickness of a second portion 3094 of the second photoresist 309. The first portion 3092 of the second photoresist 309 is corresponding to a region where the drain electrode is formed, and the second portion 3094 of the second photoresist 309 is corresponding to a region where the gate electrode and the second insulation pattern are formed. Such arrangement facilitates removing of the first portion 3092 of the second photoresist 309.

The step S2023 is to expose and develop the second photoresist with a half-tone mask plate, and then etch the second metal layer, the second oxide layer and the first oxide layer, thereby obtaining the gate electrode, the second insulation pattern and the active layer.

Specifically, the gate electrode 306, the second insulation pattern 305 and the active layer 304 maybe formed by means of wet etching.

Different from first forming the drain electrode after formation of the first insulation pattern in the related art, according to the above steps, after formation of the first insulation pattern 303, the gate electrode 306, the second insulation pattern 305 and the active layer 304 are formed first.

Specifically, as shown in FIG. 5 and FIG. 13, the step S203 may include the following steps S2031 to S2032.

The step S2031 is to remove away the first portion 3092 of the second photoresist 309 which is corresponding to the region where the drain electrode is formed, by means of ashing the second photoresist, thereby exposing a part of the gate electrode on the active layer.

Since the first portion 3092 of the second photoresist 309 is thin, the first portion 3092 of the second photoresist 309 is easily removed by means of ashing in the step S2031. After the first portion 3092 of the second photoresist 309 is removed, the exposed part of the gate electrode 306 on the active layer 304 is no longer protected by the second photoresist 309, thereby facilitating removing of the exposed part of the gate electrode 306 and the second insulation pattern 305 under the exposed part of the gate electrode 306.

The step S2032 is to etch the exposed part of the gate electrode and the second insulation pattern under the exposed part of the gate electrode, thereby exposing the first portion of portions of the active layer on the first insulation pattern.

In this step, the exposed part of the gate electrode 306 and the second insulation pattern 305 under the exposed part of the gate electrode 306 may be removed away by means of wet etching, so that the first portion 3041 of portions of the active layer 304 on the first insulation pattern 303 is exposed. Since the active layer 304 is to be reserved, the active layer 304 may be made of material which is resistant to the etching liquid used to etch the second insulation layer 305, thereby preventing the active layer 304 from being etched in the process of etching the second insulation pattern 305.

Through the above steps, the first portion 3041 of portions of the active layer 304 on the first insulation pattern 303 is exposed, and the first portion 3041 of the active layer 304 is used to form the drain electrode 307, thereby reducing one mask process for manufacturing the drain electrode 307 as compared with the related art.

In sum, as compared with the related art, in the method for manufacturing thin film transistors according to embodiments of the present disclosure, it is not needed to form the drain electrode 307 on the first insulation pattern 303 by means of one patterning process with one mask plate. Instead, first, the active layer 304, the second insulation pattern 305 and the gate electrode 306 are formed on the substrate 301, the exposed portion of the source electrode 302 which is not covered by the first insulation pattern, and the first insulation pattern 303 in such a manner that the active layer 304, the second insulation pattern 305 and the gate electrode 306 are stacked on another; then, the exposed first portion 3041 of the active layer 304 is subjected to a plasma treatment, and then the first portion 3041 of the active layer 304 is fabricated into the drain electrode 307. Thus, one mask process for manufacturing the drain electrode in the related art can be eliminated, thereby simplifying the process and improving productivity. Meanwhile, according to the method of the present disclosure, the drain electrode 307 of the thin film transistor is formed from a part of the active layer 304, thus materials of the drain electrode 307 and the active layer 304 are the same, thereby solving the problem in the related art that the drain electrode and the active layer are made of different materials, which results in poor ohmic contact.

In addition, the drain electrode 307 of the thin film transistor is formed from a part of the active layer 304, thus the dual-layer overlap structure formed by the drain electrode and the active layer in the related art can be eliminated, and then the action layer 304 and the drain electrode 307 are in an identical layer on the first insulation pattern 303, thereby effectively reducing overlapping parasitic capacitance and then improving display effect.

One embodiment of the present disclosure further provides a thin film transistor. The thin film transistor can be used to fabricate an array substrate. The thin film transistor may be a thin film transistor with vertical structure.

As shown in FIG. 14, the thin film transistor includes a substrate 301, a source electrode 302, a first insulation pattern 303, a drain electrode 307, an active layer 304, a second insulation pattern 305 and a gate electrode 306. The source electrode 302, the first insulation pattern 303, the drain electrode 307, the active layer 304, the second insulation pattern 305 and the gate electrode 306 are arranged on the substrate 301. The drain electrode 307 and a part of the active layer 304 are in an identical layer. In one embodiment, the drain electrode 307 and a part of the active layer 304 on a top surface (when the thin film transistor is arranged in an orientation shown in FIG. 14) of the first insulation pattern 303 are in an identical layer.

The drain electrode 307 and a part of the active layer 304 are in an identical layer, thus the dual-layer overlap structure formed by the drain electrode and the active layer in the related art can be eliminated, thereby effectively reducing overlapping parasitic capacitance and then improving display effect.

Optionally, materials of the drain electrode 307 and the active layer 304 are the same. Specifically, the active layer 304 may be made of oxide material which is resistant to the etching liquid used to etch the second insulation layer 305. For example, the active layer 304 may be made of a material selected from at least one of indium gallium zinc tin oxide (IGZTO), indium tin zinc oxide (ITZO) and indium tin gallium oxide (ITGO). The drain electrode 307 may be made of material such as indium tin zinc oxide, indium tin gallium oxide and indium gallium zinc tin oxide which are conductive due to the plasma treatment.

The materials of the drain electrode 307 and the active layer 304 are the same, thereby solving the problem in the related art that the drain electrode and the active layer are made of different materials, which results in poor ohmic contact.

Specifically, the source electrode 302 and the gate electrode 306 may be made of common metal material, or transparent conductive oxide material. For example, the source electrode 302 and the gate electrode 306 may be made of material selected from at one of Mo, Cu, Al, AlNd, and indium tin oxide (ITO). The first insulation pattern 303 is made of SiOx, and has a thickness which is greater than or equal to 4000 Å, thereby ensuring insulation effect. The second insulation pattern 305 is made of high-k metal oxide dielectric material to reduce leakage of electricity. For example, the second insulation pattern 305 may be made of $Al_2O_3$.

In sum, in the thin film transistor according to one embodiment of the present disclosure, the drain electrode 307 and a part of the active layer 304 on the top surface 3031 of the first insulation pattern 303 are in an identical layer on the top surface 3031 of the first insulation pattern 303, thus the dual-layer overlap structure formed by the drain electrode and the active layer in the related art can be eliminated, thereby effectively reducing overlapping parasitic capacitance and then improving display effect. In addition, the materials of the drain electrode 307 and the active layer 304 are the same, thereby solving the problem in the related art that the drain electrode and the active layer are made of different materials, which results in poor ohmic contact.

One embodiment of the present disclosure further provides a display device which includes the above thin film transistor.

Since the display device includes the above thin film transistor, the display device has a good display effect.

Other embodiments of the disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and examples be considered as exemplary only, with a true scope and spirit of the disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. A thin film transistor comprising:
   a substrate;
   a source electrode on the substrate;
   a first insulation pattern on the source electrode;
   a drain electrode on the first insulation pattern; and
   an active layer with one part on the first insulation pattern;
   wherein the drain electrode and the one part of the active layer on the first insulation pattern are in an identical layer; and
   wherein the source electrode is sandwiched between the substrate and the first insulation pattern;
   wherein an orthographic projection of the first insulation pattern at the substrate is within an orthographic projection of the source electrode at the substrate;
   wherein the drain electrode is on a top surface of the first insulation pattern; and the one part of the active layer is on the top surface of the first insulation pattern; wherein the drain electrode and the one part of the active layer on the top surface of the first insulation pattern are in an identical layer; and the top surface of the first insulation pattern is substantially parallel to a top surface of the substrate.

2. The thin film transistor of claim 1, wherein the drain electrode is made of a material formed by converting the material which is used to form the active layer into a conductor by means of the plasma treatment.

3. The thin film transistor of claim 1, wherein the active layer is made of a material selected from at least one of indium gallium zinc tin oxide (IGZTO), indium tin zinc oxide (ITZO) and indium tin gallium oxide (ITGO); and the drain electrode is made of a material selected from at least one of indium tin zinc oxide, indium tin gallium oxide and indium gallium zinc tin oxide which are conductive via plasma treatment.

4. The thin film transistor of claim 1, further comprising a second insulation pattern on the active layer and a gate electrode on the second insulation pattern.

5. The thin film transistor of claim 4, wherein each of the source electrode and the gate electrode is made of material selected from at least one of Mo, Cu, Al, AlNd, and indium tin oxide (ITO).

6. The thin film transistor of claim 4, wherein the second insulation pattern is made of $Al_2O_3$.

7. The thin film transistor of claim 1, wherein the first insulation pattern is made of silicon oxide.

8. The thin film transistor of claim 1, wherein the first insulation pattern has a thickness which is greater than or equal to 4000 Å.

9. The thin film transistor of claim 1, wherein the active layer covers a portion of the source electrode which is not covered by the first insulation pattern, and a part of the first insulation pattern.

10. The thin film transistor of claim 9, wherein one part of the active layer is in direct contact with the portion of the source electrode which is not covered by the first insulation pattern, and another part of the active layer is in direct contact with the part of the first insulation pattern.

11. A display device, comprising the thin film transistor of claim 1.

* * * * *